(12) United States Patent
Walter et al.

(10) Patent No.: US 9,261,791 B2
(45) Date of Patent: Feb. 16, 2016

(54) PHOTORESIST APPLICATION

(71) Applicant: Infineon Technologies AG, Neubiberg (DE)

(72) Inventors: Thomas Walter, Treffen (AT); Andreas Behrendt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/833,480

(22) Filed: Mar. 15, 2013

(65) Prior Publication Data

US 2014/0272705 A1    Sep. 18, 2014

(51) Int. Cl.
*G03F 7/26*  (2006.01)
*G03F 7/16*  (2006.01)

(52) U.S. Cl.
CPC ............. *G03F 7/168* (2013.01); *G03F 7/162* (2013.01)

(58) Field of Classification Search
CPC ............ G03F 7/16; G03F 7/162; G03F 7/168
USPC ................................................ 430/330, 270.1
See application file for complete search history.

(56) References Cited

U.S. PATENT DOCUMENTS

2008/0286697 A1    11/2008  Verhaverbeke et al.
2011/0033626 A1*   2/2011   Fukuda et al. ............. 427/372.2
2012/0322241 A1    12/2012  Holden et al.

* cited by examiner

*Primary Examiner* — Daborah Chacko Davis
(74) *Attorney, Agent, or Firm* — Slater & Matsil, L.L.P.

(57) ABSTRACT

Devices and methods are provided where photoresist is applied on a substrate and at least some regions of the photoresist are dried prior to removing a substrate from a substrate support.

21 Claims, 2 Drawing Sheets

PHOTORESIST APPLICATION

TECHNICAL FIELD

The present application relates to the application of photoresist to substrates like semiconductor wafers, for example in the course of manufacturing devices on such substrates.

BACKGROUND

In the course of processing substrates, for example semiconductor wafers or other kinds of substrates, photolithography is often performed to provide a mask for processing steps like etching or other operations which are to be applied only to part of the substrates. Typically, for photolithography a photoresist is applied to the substrate, the photoresist is exposed through a mask such that only defined regions of the photoresist are exposed to light, and the photoresist is subsequently developed. In case of positive photoresists, the regions exposed to light may be removed during the development, while for negative photoresists the regions not exposed to light are removed during the development of the photoresist.

In typical processing environments, substrates are transferred between the various processing steps like applying photoresist, exposing the substrate to light and developing the photoresist, by means of a mechanical gripper arm or other similar device which grips the substrate at a periphery thereof. However, this may lead to problems in some cases when the gripping device grips the periphery of the substrate where photoresist is applied, as the photoresist may for example adhere to the gripping device.

In some conventional solutions, the photoresist may be removed at the peripheral portion of the substrate prior to transferring the substrate using the gripping device. However, at least for some kinds of processing it may be desirable that the peripheral portion of the substrate remains coated with photoresist.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

In the following, various embodiments will be described in detail with reference to the attached drawings. It should be noted that these embodiments serve only as examples and are not to be construed as limiting. For example, while embodiments may be described having a plurality of features, other embodiments may comprise less features and/or alternative features. Furthermore, features from different embodiments may be combined with each other unless specifically noted otherwise.

Some embodiments relate to applying a photoresist to a substrate. A photoresist as generally understood in the art is a substance which may be chemically altered by irradiating the photoresist with electromagnetic radiation, for example visible or ultraviolet light. In case of a positive photoresist, the irradiated parts of the photoresist may then be removed using a developing solution, while for negative photoresists the non-irradiated parts may be removed.

A photosensitivity range herein is used to denote the wavelength range in which a photoresist is sensitive to irradiation such that the above-mentioned chemical alteration takes place. For example, for some commercial photoresists the photosensitivity range may comprise ultraviolet light or light in the blue wavelength range, while it may exclude for example red light or infrared light. In such cases, for example rooms where photolithography using the photoresists takes place may be illuminated by red light outside the photosensitivity range of the photoresist.

While in the following in some embodiments semiconductor wafers like silicon wafers will be used as an example for substrates to be processed, in other embodiments, other kinds of substrates, for example glass substrates coated for example with organic materials or any other materials may be used. Embodiments described herein are applicable both to non-processed substrates and to substrates which have been processed previously by conventional processing.

Figure 1:
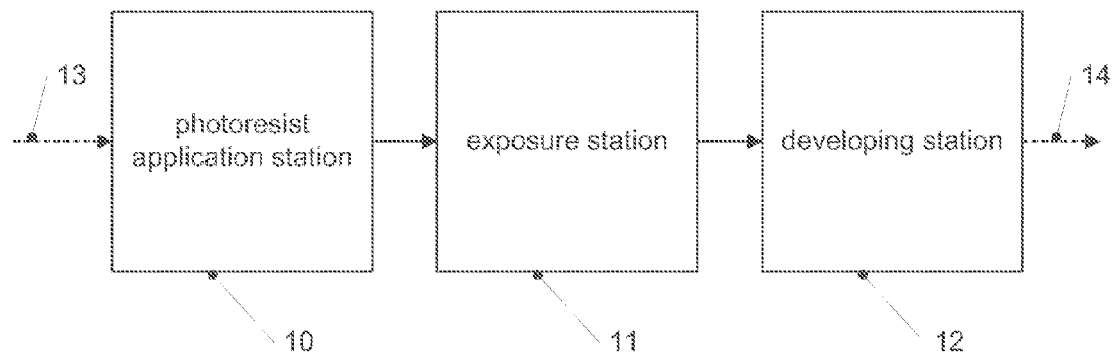
FIG. 1 is a schematic diagram of a processing apparatus according to an embodiment.

In FIG. 1, a processing apparatus to perform photolithography on a substrate according to an embodiment is shown. The apparatus as schematically shown in FIG. 1 comprises a photoresist application station 10, an exposure station 11 and a developing station 12. These stations may be located close to each other or remote from each other and substrates may be transferred from one station to the next using conventional devices like a gripping device, a wafer cassette for transport and the like.

Substrates like semiconductor wafers, for example silicon wafers, are fed to photoresist application station 10 as indicated by an arrow 13. These substrates may be unprocessed substrates or pre-processed substrates, i.e., substrates where some processing has already been performed, including previous photolithography processing, etching, epitaxy, doping and the like. Substrates are removed from developing station 12 as indicated by an arrow 14. These substrates may then be further processed, for example an etching, doping for example via ion implantation, epitaxy or other conventional processing may be performed.

In photoresist application station 10, photoresist is applied to the substrate. Prior to removing the substrate from a substrate support of photoresist application station 10, the photoresist is dried at least in some regions thereof. For example, regions where the substrate subsequently is gripped by a gripping device for transferring the substrate to exposure station 11 may be dried, such that the photoresist for example does not adhere to the gripping device. In other embodiments, the complete photoresist may be dried. In some embodiments, the drying may be performed using radiation outside a photosensitivity range of the photoresist, for example infrared radiation. Examples for photoresist application devices usable in photoresist application station 10 will be explained later in more detail with reference to FIGS. 2 and 3. While drying, a solvent in the photoresist for example may be evaporated. In some embodiments, by drying the complete photoresist, a later placement of the wafer into a separate drying device, for example a so-called hot plate, may be omitted.

After a photoresist has been applied to the substrate in photoresist application station 10, the substrate is transferred to exposure station 11. In exposure station 11, desired regions of the photoresist are exposed to radiation within the photosensitivity range of the photoresist, for example ultraviolet radiation. Subsequently, the substrate is transferred to developing station 12 where the photoresist is developed using a developing solution.

It should be noted that while three distinct stations 10, 11, 12 are shown in FIG. 1, the function described may be performed in a single apparatus in some embodiments. In other embodiments, as already mentioned, the various stations may even be located remote from each other. In still other embodiments, two stations may be implemented in a single apparatus, for example exposure station 11 and developing station 12, whereas photoresist application station 10 forms a separate apparatus.

Figure 2:
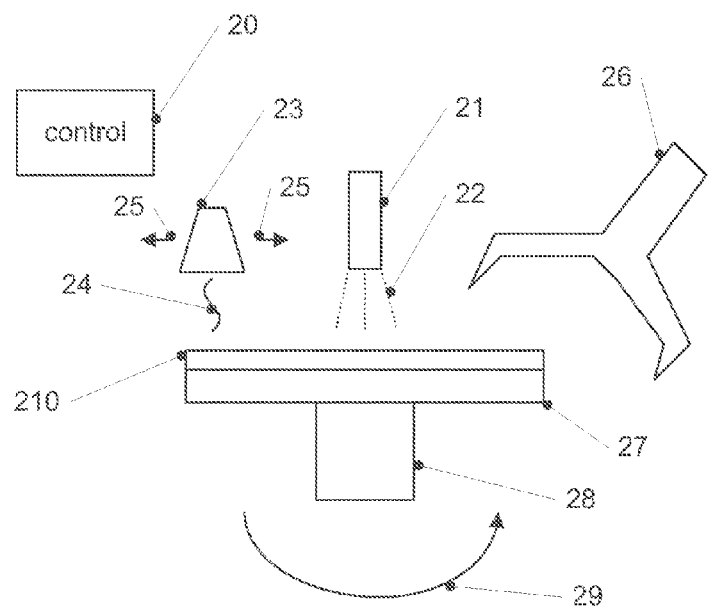
FIG. 2 is a schematic view showing a photoresist application device according to an embodiment.

In FIG. 2, a photoresist application device according to an embodiment is shown. The photoresist application device of FIG. 2 may be used in photoresist application station 10 of the embodiment of FIG. 1, but may also be used in other embodiments to apply photoresist.

In the embodiment of FIG. 2, a gripping device 26 controlled by a control 20 is used to place a substrate 210 onto a substrate support 27, for example a chuck. In some embodiments, as conventionally known substrate 210 may be held to substrate support 27 using a vacuum, e.g., by holes in substrate support 27 where a vacuum is established such that substrate 210 is held on substrate support 27. As this is a conventional technique, it is not shown in detail in FIG. 2. Other conventional techniques, for example mechanical holders, may likewise be used to hold substrate 210 on substrate support 27. In other embodiments, no specific mechanism for holding substrate 210 at substrate support 27 may be provided, and substrate 210 may rest on substrate support 27 held simply by gravity. In some embodiments, substrate 210 may be a silicon wafer.

In the embodiment of FIG. 2, substrate support 27 and therefore substrate 210 is rotatable as indicated by an arrow 29 using a drive unit 28, which for example may comprise an electric motor. Drive unit 28 likewise may be controlled by control 20. To apply a photoresist on substrate 210, in some embodiments for example substrate support 27 and therefore substrate 210 is rotated using drive unit 28, and photoresist 22 is applied near the center of substrate 210 using a photoresist application nozzle 21. Nozzle 21 is an example for a photoresist application device to apply photoresist on substrate 210. This application may likewise be controlled by control unit 20. Due to centrifugal forces based on the rotation of substrate 210, the photoresist is then dispersed on substrate 210. In other embodiments, more than one nozzle 21 may be used, and/or nozzle 21 may be movable such that photoresist may not only be applied at or near the center of substrate 210, but also closer to the periphery thereof. Other conventional techniques known in the art to apply photoresist on substrate 210 may likewise be used. It should be noted that in some embodiments the photoresist may be applied only to parts of the surface of substrate 210.

After photoresist 22 has been applied to substrate 210 and prior to removing substrate 210 from substrate support 27, the photoresist is dried at least in some regions thereof. To this end, the photoresist application device of FIG. 2 comprises an infrared lamp 23 for generating infrared radiation 24, the infrared radiation being used to dry the photoresist on substrate 210. For this drying process, in some embodiments infrared lamp 23 may be positioned as shown in FIG. 2 and substrate 210 may be rotated using drive unit 28, such that photoresist covering peripheral regions and/or edge regions of substrate 210 may be dried. In other embodiments, infrared lamp 203 may be moved as indicated by arrows 25 across substrate 210 to dry the photoresist essentially on the whole of substrate 210.

In embodiments, the photoresist is dried at least at locations where gripping device 26 grips substrate 210 to remove substrate 210 from substrate support 27. In this way, when gripping device 26 grips substrate 210, a risk that photoresist adheres to gripping device 26 and causes problems is reduced due to the drying. It should be noted that in the embodiment of FIG. 2, the infrared radiation generated by infrared lamp 23 is outside the photosensitivity range of photoresist 22, such that a later exposing and developing on the photoresist is not or hardly influenced by the drying process. In some embodiments, infrared lamp 23 may be moved away from substrate 210 during the application of the photoresist by nozzle 21. Likewise, in some embodiments, nozzle 21 may be moved away from substrate 210 during the drying. In other embodiments, other drying devices than infrared lamp 23 may be used, for example radiation devices emitting different wavelength outside the sensitivity range of photoresist 22 or even resistive heaters incorporated in substrate support 27. In some embodiments, more than one lamp 23 may be provided.

Figure 3:
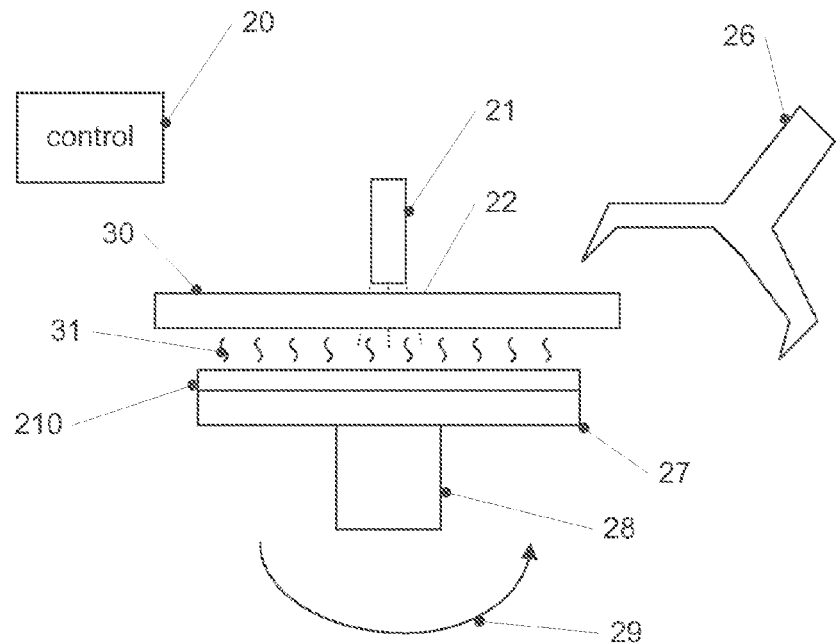
FIG. 3 is a schematic diagram showing a photoresist application device according to a further embodiment.

A further embodiment of a photoresist application device is shown in FIG. 3. Most of the elements of the embodiment of FIG. 3 correspond to elements of the embodiment of FIG. 2 and bear the same reference numeral. These elements will therefore not be described again in detail. Instead of infrared lamp 23 emitting infrared radiation 24, in the embodiment of FIG. 3 an infrared lamp 30 emitting infrared radiation 31 is provided. Infrared lamp 30 has an elongate form extending across substrate 210 to irradiate substrate 210 essentially over a complete width thereof. Therefore, when substrate 210 is rotated, photoresist may be dried on the complete wafer surface. In some embodiments, lamp 30 may be moved away from substrate 210 during application of photoresist by nozzle 21, and/or nozzle 21 may be moved away from substrate 210 during drying by lamp 30.

Other forms of lamps are equally possible, from small point-like radiators to long radiators as shown in FIG. 3.

As has been explained for the embodiment of FIG. 2, also in the embodiment of FIG. 3 other wavelengths than infrared wavelength are possible for lamp 30, as long as energy is deposited in the photoresist to dry the same and as long as the wavelength is at least essentially outside the photosensitivity range of the photoresist.

For manufacturing a photoresist application device as shown, e.g., in FIG. 2 or FIG. 3, a substrate support, a photoresist application device like a nozzle and a drying device like an infrared lamp may be provided, e.g., as shown in the figures and described above.

Figure 4:
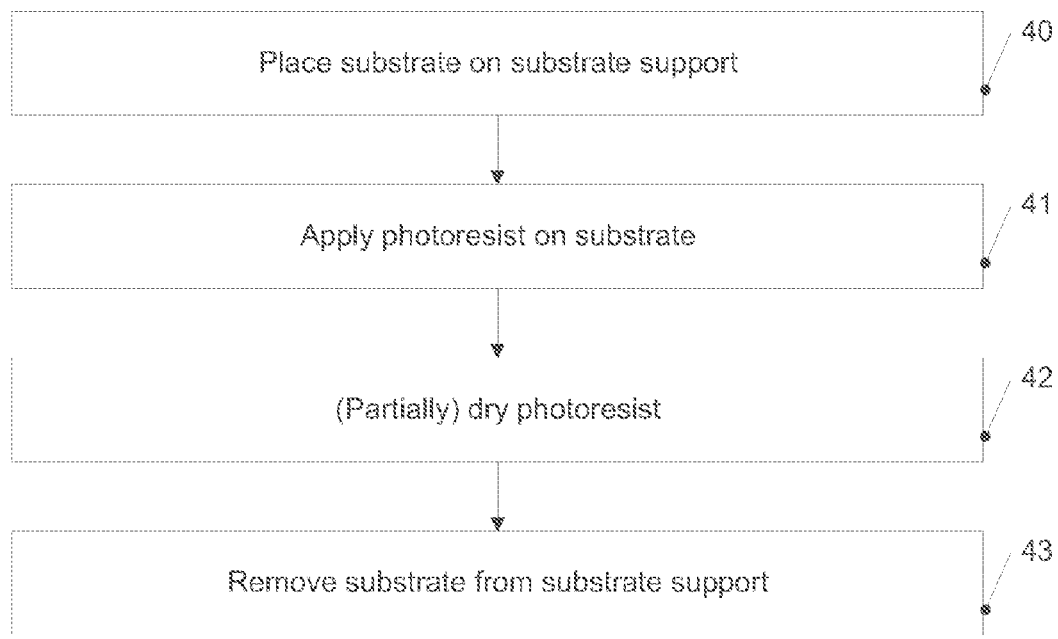
FIG. 4 is a flowchart illustrating a method according to an embodiment.

In FIG. 4, a flowchart illustrating a method according to an embodiment is shown. The method illustrated in FIG. 4 may be for example implemented in the apparatuses and devices discussed with reference to FIGS. 1-3, but may also be implemented in other apparatuses and devices.

At 40, a substrate is placed on a substrate support, for example using a gripping device. The substrate may comprise a chuck. The substrate support may comprise a semiconductor wafer, for example a silicon wafer.

At 41, photoresist is applied to the substrate on the substrate support. For example, the substrate may be rotated, and photoresist may be applied on the substrate in one or more spots, e.g., via a nozzle, which photoresist then disperses due to the rotation.

At 42, the photoresist is at least partially dried, i.e., either some regions of the photoresist are dried or the complete photoresist is dried, while the substrate is still on the substrate support. For drying, for example infrared radiation or other radiation outside a photosensitivity range of the photoresist may be used.

After the drying, at 43 the substrate is removed from the substrate support. In some embodiments, through the drying problems caused by a gripping device touching still wet photoresist may be avoided or mitigated.

It should be noted that the method described with reference to FIG. 4 may be part of a processing of the semiconductor device, with additional conventional processing being performed prior to the placement of the substrate on the substrate support at 40 and/or after the removal of the substrate from the substrate support at 43. Such conventional processing may include doping, ion implantation, deposition of further layers, epitaxy, or etching, but is not limited to these examples.

As evident from the above specification, numerous modifications and variations are possible without leaving of the present specification. Therefore, the above-described embodiments serve merely for illustration purposes and are not to be construed as limiting the scope of the present application in any way.

What is claimed is:

1. A device comprising:
   a substrate support;
   a photoresist application device, wherein in operation the photoresist application devices applies photoresist on a substrate on the substrate support;
   a drying device, wherein in operation the drying device dries at least regions of the photoresist on the substrate while the substrate is on the substrate support; and
   a gripping device, wherein in operation the gripping device after application of the photoresist grips the substrate only after drying by the drying device at the dried regions and removes the substrate from the substrate support while a peripheral portion of the substrate remains coated with the photoresist applied by the photoresist application device.

2. The device of claim 1, wherein the substrate support is rotatable.

3. The device of claim 2, wherein the photoresist application device comprises a nozzle to apply photoresist to the substrate.

4. The device of claim 1, wherein the drying device comprises a radiation emitting device.

5. The device of claim 4, wherein the radiation emitting device comprises an infrared lamp.

6. The device of claim 4, wherein the radiation emitting device is sized to irradiate a spot on the substrate.

7. The device of claim 4, wherein the radiation emitting device is postionable to irradiate a peripheral part including the peripheral portion of the substrate.

8. The device of claim 4, wherein the radiation emitting device irradiates the substrate essentially over a complete width of the substrate.

9. The device of claim 4, wherein the radiation emitting device emits radiation with a wavelength outside a photosensitivity range of the photoresist.

10. A device comprising:
    a rotatable substrate support;
    a nozzle, wherein in operation the nozzle applies photoresist on a substrate on the substrate support;
    an infrared lamp, wherein in operation the infrared lamp irradiates at least part of the substrate on the substrate support with infrared radiation; and
    a gripping device, wherein in operation the gripping device after application of the photoresist by the nozzle grips the substrate only after irradiating by the infrared lamp and removes the substrate from the substrate support by gripping the substrate on an irradiated portion of the photoresist while a peripheral portion of the substrate remains coated with the photoresist applied by the nozzle.

11. The device of claim 10, wherein the infrared lamp is movable.

12. The device of claim 10, wherein the infrared lamp extends across the substrate support.

13. The device of claim 10, wherein the substrate support comprises a chuck.

14. The device of claim 10, wherein the infrared lamp is positionable above a peripheral region including the peripheral portion of the substrate.

15. A method comprising:
    placing a substrate on a substrate support;
    applying photoresist on the substrate while the substrate is on the substrate support;
    drying at least regions of the photoresist while the photoresist is on the substrate; and
    removing the substrate from the substrate support by gripping the substrate at the dried regions of the photoresist while a peripheral portion of the substrate remains coated with the applied photoresist, wherein after applying the photoresist, gripping of the substrate occurs only after drying.

16. The method of claim 15, wherein the drying comprises irradiating the photoresist.

17. The method of claim 16, wherein the irradiating comprises irradiating with a wavelength outside a photosensitivity range of the photoresist.

18. The method of claim 15, wherein the drying comprises drying the photoresist essentially over a complete surface of the substrate.

19. A method for manufacturing a device comprising:
    providing a substrate support;
    providing a photoresist application device, wherein in operation the photoresist application device applies photoresist on a substrate on the substrate support;
    providing a drying device, wherein in operation the drying device dries at least regions of the photoresist on the substrate while the substrate is on the substrate support; and
    providing a gripping device, wherein in operation the gripping device after application of the photoresist grips the substrate at the at least dried regions of the photoresist only after drying by the drying device while a peripheral portion of the substrate remains coated with the photoresist applied by the photoresist application device.

20. The method of claim 19, wherein providing the drying device comprises providing a radiation emitting device.

21. The method of claim 20, wherein providing the radiation emitting device comprises providing an infrared lamp.

* * * * *